(12) United States Patent
Weiner et al.

(10) Patent No.: US 9,059,223 B2
(45) Date of Patent: Jun. 16, 2015

(54) MODULAR FLOW CELL AND ADJUSTMENT SYSTEM

(75) Inventors: Kurt Weiner, San Jose, CA (US); Aaron Francis, San Jose, CA (US); Ken Williams, Livermore, CA (US)

(73) Assignee: Intermolecular, Inc., San Jose, CA (US)

(*) Notice: Subject to any disclaimer, the term of this patent is extended or adjusted under 35 U.S.C. 154(b) by 1500 days.

(21) Appl. No.: 12/333,226

(22) Filed: Dec. 11, 2008

(65) Prior Publication Data
US 2009/0155936 A1 Jun. 18, 2009

Related U.S. Application Data

(60) Provisional application No. 61/013,038, filed on Dec. 12, 2007.

(51) Int. Cl.
| | | |
|---|---|---|
| *B05C 5/00* | (2006.01) | |
| *C40B 60/00* | (2006.01) | |
| *H01L 21/67* | (2006.01) | |

(52) U.S. Cl.
CPC ...... *H01L 21/6719* (2013.01); *H01L 21/67028* (2013.01); *H01L 21/67051* (2013.01); *H01L 21/6715* (2013.01)

(58) Field of Classification Search
USPC ............ 118/719, 733, 420; 356/246; 250/288
See application file for complete search history.

(56) References Cited

U.S. PATENT DOCUMENTS

| | | | |
|---|---|---|---|
| 5,407,449 A | 4/1995 | Zinger | 29/25.01 |
| 6,605,257 B1 * | 8/2003 | Nakazawa et al. | 506/40 |
| 6,872,258 B2 | 3/2005 | Park et al. | 118/715 |
| 7,273,526 B2 | 9/2007 | Shinriki et al. | 118/715 |
| 2001/0022950 A1 * | 9/2001 | Hall et al. | 422/131 |
| 2002/0028456 A1 * | 3/2002 | Mansky et al. | 435/6 |
| 2003/0032198 A1 * | 2/2003 | Lugmair et al. | 436/180 |
| 2003/0133358 A1 * | 7/2003 | Karp | 366/341 |
| 2003/0198789 A1 * | 10/2003 | Koyama et al. | 428/195.1 |
| 2005/0056215 A1 * | 3/2005 | Shimoda | 118/668 |
| 2006/0201813 A1 * | 9/2006 | Balisky et al. | 205/80 |
| 2006/0240545 A1 * | 10/2006 | Tomida et al. | 435/289.1 |
| 2007/0085208 A1 * | 4/2007 | Hsu et al. | 257/758 |
| 2008/0312090 A1 * | 12/2008 | Fresco et al. | 506/3 |

FOREIGN PATENT DOCUMENTS

JP 2007-242980 9/2007 ............ H01L 21/677

* cited by examiner

*Primary Examiner* — Charles Capozzi

(57) ABSTRACT

A combinatorial processing system having modular dispense heads is provided. The modular dispense heads are disposed on a rail system enabling an adjustable pitch of the modular dispense heads for the combinatorial processing. The modular dispense heads are configured so that sections of the modular dispense heads are detachable in order to accommodate various processes through a first section without having to completely disconnect and re-connect facilities to a second section.

7 Claims, 14 Drawing Sheets

MODULAR FLOW CELL AND ADJUSTMENT SYSTEM

CLAIM OF PRIORITY

This application claims the benefit of U.S. Application Ser. No. 61/013,038 filed Dec. 12, 2007, which is incorporated by reference in its entirety for all purposes.

BACKGROUND

Combinatorial processing enables rapid evaluation of semiconductor processes. The systems supporting the combinatorial processing are flexible to accommodate the demands for running the different processes either in parallel, serial or some combination of the two.

Some exemplary semiconductor wet processing operations include operations for adding (electro-depositions) and removing layers (etch), defining features, preparing layers (e.g., cleans), etc. Similar processing techniques apply to the manufacture of integrated circuits (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct R&D on full wafer processing through the use of split lots, as the deposition systems are designed to support this processing scheme. This approach has resulted in ever escalating R&D costs and the inability to conduct extensive experimentation in a timely and cost effective manner. Combinatorial processing as applied to semiconductor manufacturing operations enables multiple experiments to be performed on a single substrate.

An improved technique for accommodating gathering of additional data for multiple process variations on a single substrate is provided to enhance the evaluation of different materials, unit processes, or process sequences.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1A:
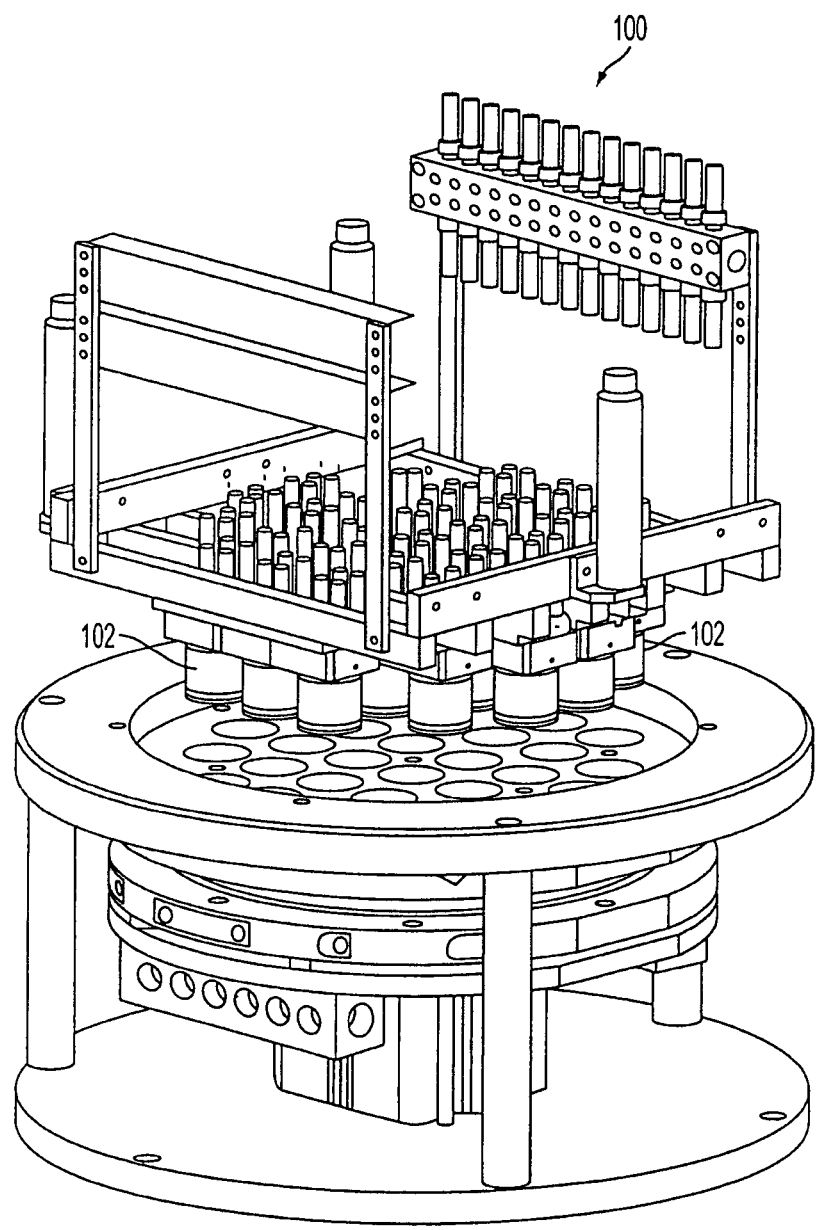
FIG. 1A is a simplified schematic diagram of a combinatorial system which may incorporate wet processing experiments or semiconductor manufacturing process sequences and unit operations in order to combinatorially evaluate various semiconductor manufacturing processes so that an optimum process may be found in a minimum amount of time in accordance with one embodiment of the invention.

The embodiments described herein provide a method and apparatus for a modular combinatorial processing head enabling efficient reconfiguration of a site isolated reactor. It will be obvious, however, to one skilled in the art, that the present invention may be practiced without some or all of these specific details. In other instances, well known process operations have not been described in detail in order not to unnecessarily obscure the present invention.

The embodiments described below provide site isolated reactors having configurable dispense heads for combinatorial processing. With the modular design described herein, the process of changing the hydrodynamic, agitation, or any other characteristics of an individual reactor in a site isolated multi-channel reactor is simplified. In order to simplify the design, a modular configuration for a reactor insert is described in more detail below. Also described herein is a system for adjusting the spacing of the reactors and flow cells to accommodate different substrates, die configurations, test structure locations, etc. This adjustment system, can be used with the modular flow cell mentioned above or a monolithic block design in which both the reactor and the facilities interface are combined into one integral unit. As will be discussed in further detail below, separating the facilities functionality from the reactor configuration enables a more efficient changeover between or during experiments or process sequences.

The modularization of the reactor is achieved by grouping the common facilities requirements in one portion (a "facilities module") and enabling a second portion (a "process module") to be interchanged depending on the experiment or characteristics needed. Common facility requirements include providing inlet ports for a chemical solution and outlet ports for removing waste from the reaction vessel, the valving and bypasses necessary to achieve desired flow combinations, providing electrical connections for valves, as well as applying a potential inside the reactor cell, and/or drive mechanisms, for providing rotation for agitation, scrubbing, brushing, etc. A pressure based feed through may enable agitation or scrubbing in one embodiment, and an electrical feed through may be desired to provide a bias internal to the reaction chamber, e.g., for electroplating experiments. Integrating these features on a single block that incorporates a standardized interface to a second module that dictates the flow, agitation, and other characteristics within the reaction chamber provides a much more efficient design. Thus, when different characteristics or capabilities are required, process changes are achieved by replacing the process module, which is removably mated to the facilities module.

The embodiments described below further provide details for a multi-region processing system and associated processing heads that enable processing a substrate in a combinatorial fashion. Thus, different regions of the substrate may have different properties, which may be due to variations of the materials, unit processes (e.g, processing conditions or parameters) and process sequences, etc. For some embodiments, within each region the conditions are preferably substantially uniform so as to mimic conventional full wafer processing within each region. However, useful results can be obtained for certain experiments without this requirement. In one embodiment, the different regions are isolated so that there is no inter-diffusion between the different regions.

In addition, the combinatorial processing of the substrate may be combined with conventional processing techniques where substantially the entire substrate is uniformly processed (e.g., subjected to the same materials, unit processes and process sequences). Thus, the embodiments described herein can pull a substrate from a manufacturing process flow, perform combinatorial processing and return the substrate to the manufacturing process flow for further processing. Alternatively, the substrate can be processed in an integrated tool that allows both combinatorial and conventional processing in various chambers attached around a central chamber or within a R&D facility such as a clean room. Consequently, in one substrate, information concerning the varied processes and the interaction of the varied processes with conventional processes can be evaluated. Accordingly, a multitude of data is available from a single substrate for a desired process.

The embodiments described herein enable the application of combinatorial techniques for process sequence integration of semiconductor manufacturing operations. Combinatorial processing applied to semiconductor manufacturing operations assists in arriving at a globally optimal sequence of semiconductor manufacturing operations by considering interaction effects between the unit manufacturing operations, the process sequence of the unit manufacturing operations, the process conditions used to effect such unit manufacturing operations, as well as materials characteristics of components utilized within the unit manufacturing operations. The embodiments described below provide details for a multi-region processing system and associated reaction chambers that enable processing a substrate in a combinatorial fashion. In one embodiment, the different regions are isolated (e.g., 'site-isolated') so that there is no interdiffusion between the different regions.

The embodiments are capable of analyzing a portion or subset of the overall process sequence used to manufacture semiconductor devices. Once the subset of the process sequence is identified for analysis, combinatorial process sequence integration testing is performed to optimize the materials, unit processes, and process sequences used to build that portion of the device or structure. According to some embodiments described herein, the processing may take place over structures formed on the semiconductor substrate, which are equivalent to the structures formed during actual production of the semiconductor device. For example, structures may include, but not be limited to, trenches, vias, interconnect lines, capping layers, masking layers, diodes, memory elements, gate stacks, transistors, or any other series of layers or unit processes that create a structure found on semiconductor chips.

In some embodiments, while the combinatorial processing varies certain materials, unit processes, or process sequences, the composition or thickness of the layers or structures, or the action of the unit process is substantially uniform for each region. It should be noted that the process can be varied between regions, for example, a thickness of a layer is varied or one of various process parameters or conditions, such as a voltage, flow rate, etc., may be varied between regions, as desired by the design of the experiment. The result is a series of regions on the substrate that contains structures or unit process sequences that have been uniformly applied within that region and, as applicable, across different regions. This process uniformity allows comparison of the properties within and across the different regions such that variations and test results are due to the parameter being modified, e.g., materials, unit processes, unit process parameters, or process sequences, and not the lack of process uniformity. In essence, the combinatorial processing performs semiconductor manufacturing operations on multiple regions of a substrate so that the multiple regions are processed differently to achieve different results.

FIG. 1A is a simplified schematic diagram of a combinatorial system which may incorporate wet processing experiments or semiconductor manufacturing process sequences and unit operations in order to combinatorially evaluate various semiconductor manufacturing processes so that an optimum process may be found in a minimum amount of time in accordance with one embodiment of the invention. System 100 includes a plurality of flow cells 102 which may be modular in design as described further below in order to efficiently evaluate a plurality of processes and utilize the same tool on various programs addressing customer specific problems and enabling the use of using customer specific wafers without requiring re-tooling. In one embodiment, 28 flow cells are provided for 28 discrete regions of a 12-inch wafer. It should be appreciated that this is not meant to be limiting as any number of flow cells may be accommodated on a system depending on various factors including the size and shape of the substrate being evaluated, the size of the regions on the substrate, etc. In the discussion below, a monolithic block design is first described and then a modular design is later described for illustrative purposes since either can be used in certain aspects of the invention. In addition, a rail system enabling flow cells 102 to be tailored to any pitch (e.g., spacing) of regions is provided. A flexible reactor based system is also described in addition to a static manifold system. System 100 includes a plurality of connections (not shown for illustrative purposes) distributed to each of flow cells 102. Through the embodiments described below, the facilities connections remain intact, while the process module can be replaced with an alternative process module and mated with the facilities module through kinematic coupling in one embodiment.

One skilled in the art will appreciate that the system of FIG. 1A may be connected to various inputs that may be affixed to system 100 through racks or external to system 100. Exemplary inputs include a dispense manifold to dispense any process fluids utilized in the system, a mix vessel for optionally mixing fluids prior to delivery to system 100, and any required power and gas inputs to operate the system. In addition, a waste collection mechanism may be in communication to receive process fluids evacuated from the reaction chambers or bypassed through flow cells 102. It should be further appreciated that while flow cells 102 are depicted as each having four inputs and four outputs, the number of inputs and outputs may be varied to more or less than four as the illustrations are exemplary.

Figure 1B:
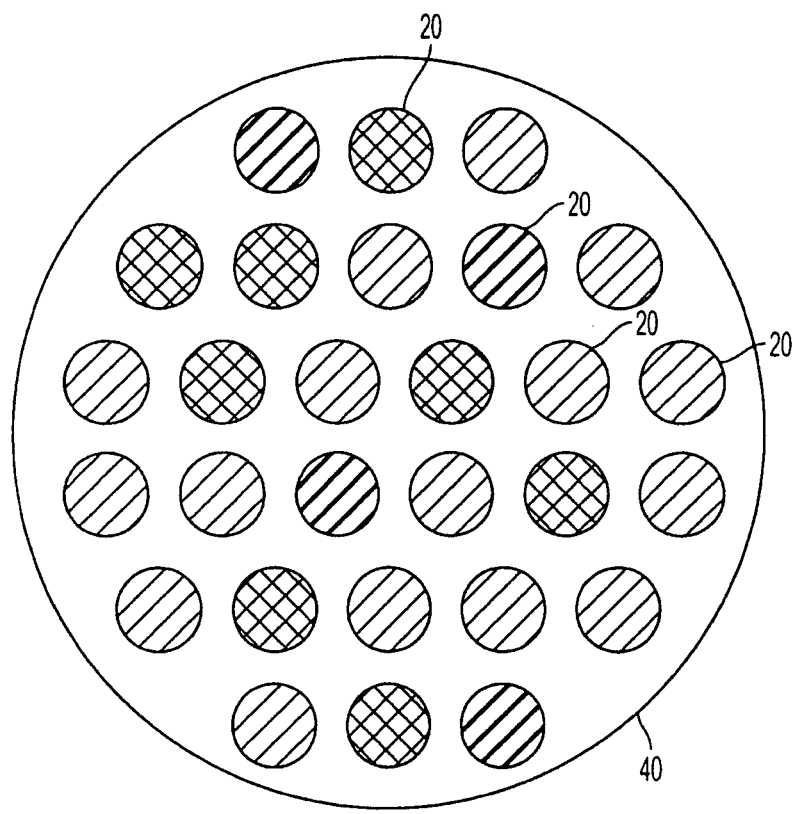
FIG. 1B is a top view of a substrate having regions processed differently through the modular head system described herein in accordance with one embodiment of the invention.

FIG. 1B is a top view of a substrate having regions processed differently through the modular head system described herein in accordance with one embodiment of the invention. Substrate 40 has a plurality of regions 20, which have been combinatorially processed. Twenty eight regions are provided on substrate 40 in this exemplary embodiment. More or fewer regions can be defined in alternative embodiments, e.g., through the system described with regard to FIGS. 9-10B. It should be appreciated that on substrate 40 a wealth of knowledge exists on a single substrate as each of regions 20 may have some property or characteristic of the process altered. Thus, the information available for each region as well as the interaction of each region with previous or subsequent process operations or materials may be harvested to provide data on an optimum material, unit process and/or process sequence in a highly efficient manner. While FIG. 1B illustrates regions 20 as isolated and not overlapping, the regions may overlap in one embodiment. In another embodiment a region refers to a localized area on a substrate which is, was, or is intended to be used for processing or formation of a selected material. The region can include one region and/or a series of regular or periodic regions preformed on the substrate. The region may have any convenient shape, e.g., circular, rectangular, elliptical, wedge-shaped, etc. In one embodiment, regions 20 are predefined on the substrate. However, the processing may define the regions 20 in another embodiment.

Figure 2C:
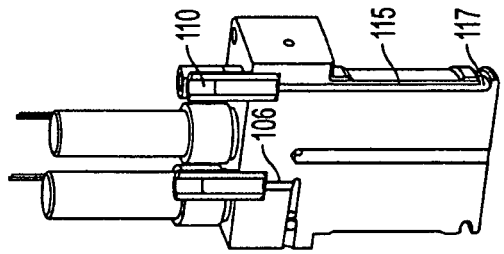
FIG. 2C is another cross sectional view of the monolithic flow cell of FIG. 2A.
Figure 2B:
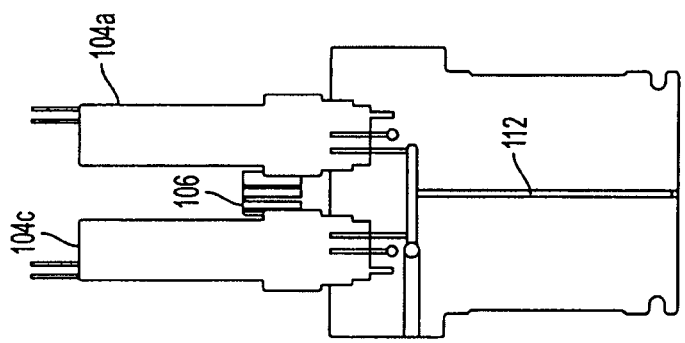
FIG. 2B is a cross-sectional diagram of the monolithic flow cell of FIG. 2A.
Figure 2A:
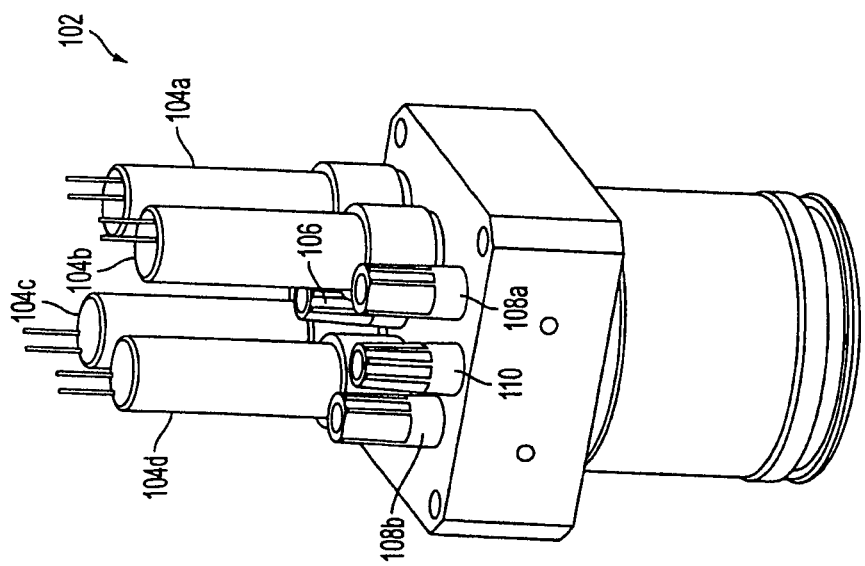
FIG. 2A is a simplified schematic diagram illustrating a monolithic design of a flow cell.

FIG. 2A is a simplified schematic diagram illustrating a monolithic design of a flow cell. Flow cell 102 includes valving and process inlets and outlets to support a specific use or function, such as radial fluid flow shown in FIGS. 2A-B. Valves 104a through 104d provide connections from external fluid supplies to the reaction chamber through flow cell 102. Ports 108a and 108b are process inlets into flow cell 102 to corresponding flow paths defined within the flow cell. Outlet 110 may be connected to a vacuum source in order to remove process waste while port 106 provides a waste bypass One skilled in the art will appreciate through the valving and drilling of the various interconnections within flow cell 102, a number of combinations of flows may be defined. For example, each valve may independently provide a flow of fluid to a substrate surface, the flows from each of the valves may be mixed, or the flows may be combined in some combination between independent flows and complete mixing of each flow. It should be noted that when using flow cell 102 of FIGS. 2A-B, the valves and ports are fixed as is the drilling and specific application or mixing supported by the cell. Furthermore, when using the monolithic flow cell in system 100 of FIG. 1, the facility connections to each of the valves and the ports mentioned above must be disassembled and reassembled between flow cell changes since the entire flow cell must be removed and replaced, including all of the connections to the tool, in a time intensive process.

FIG. 2B is a cross-sectional diagram of the monolithic block of FIG. 2A. Valves 104a and 104c may be any suitable commercially available valves, such as solenoid valves, two way valves, three way valves or other suitable valves for delivering the flow of fluids from an external fluid source to the fluid channels defined within the flow cells. Within block 102 specific channels are formed or drilled in order to accommodate the flow characteristics of this flow cell to support a particular experiment or process. In FIG. 2B, the fluid will enter the reactor through channel 112 and provide radial flow in accordance with one embodiment. As shown in FIG. 2C, vacuum channel 115 which enters peripheral annular channel 117 around a base of the bottom of the flow cell 102. In addition, bypass channel 106 is illustrated in FIG. 2C. It should be appreciated that channel 117 enables the equilibration of the vacuum from channel 115 in order to provide a uniform pressure around the peripheral edge of the reactor to encourage radial flow within the reactor and at the surface of a substrate over which the flow is applied. The modular dispense head described herein includes a process module having an evacuation channel defined along an outer region of the process module and the evacuation channel is in flow communication with a peripheral ring, i.e., peripheral annular channel 117, defined along a bottom portion of the process module. In one embodiment, multiple evacuation channels are in flow communication with the peripheral ring. The facilities module will have a removal/evacuation channel that mates with the evacuation channel of the process module and eventually be in flow communication with a vacuum source. As described herein, the modular dispense may be configured such that an inlet to the removal channel from the bottom surface of the second section is positioned to encourage radial flow of a fluid introduced into the reaction chamber from the bottom surface of the second section. That is, the peripheral ring coupled with a center inlet encourages the radial flow of fluid in the reaction chamber.

Figure 3C:
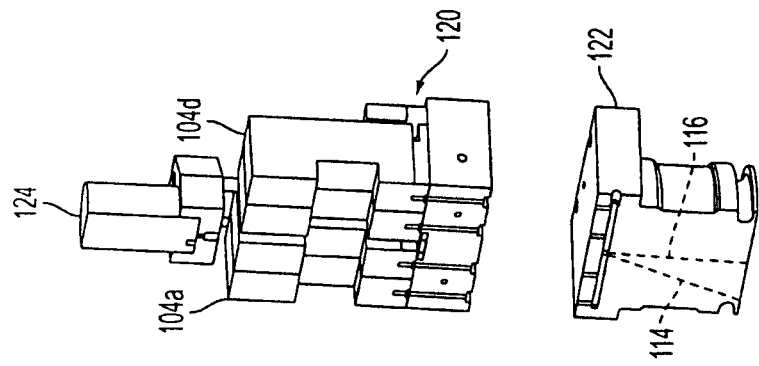
FIG. 3C is an alternative cross sectional view of the modular flow cell of FIG. 3A in accordance with one embodiment of the invention.
Figure 3B:
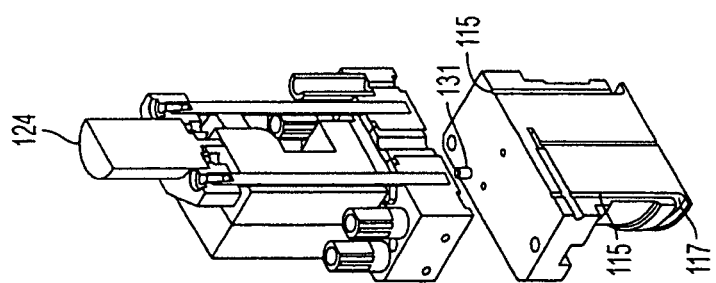
FIG. 3B is a cross sectional view of the flow cell of FIG. 3A in accordance with one embodiment of the invention.
Figure 3A:
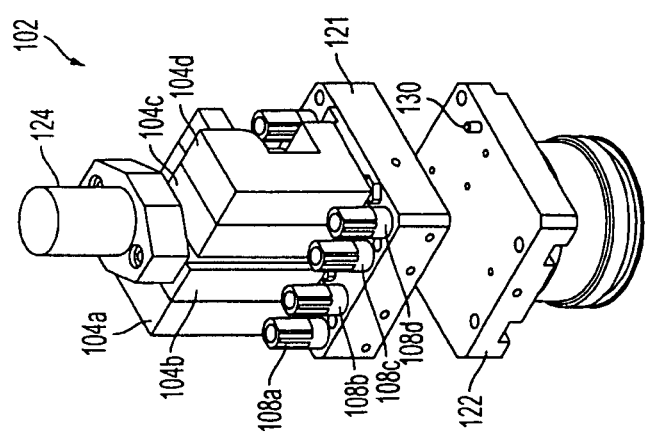
FIG. 3A is a simplified schematic diagram of a modular design of the flow cell in accordance with one embodiment of the invention.

FIGS. 3A through 3D illustrate a modular design of the flow cell in accordance with one embodiment of the invention. In FIG. 3A, facilities module 120 of flow cell 102 is configured to mount to process module 122. In one embodiment, the mounting is through a kinematic design where pins 130 and 131 are provided on a top surface of process module 122. On a corresponding bottom surface of base 121 of facilities module 120 a hole or slot may be defined therein to mate with pins 130 and 131. One skilled in the art will appreciate that multiple kinematic mating designs or other known alignment or locking techniques may be incorporated in order to mate and align the facilities module 120 with process module 122. The openings on base 121 and openings on the top surface of process module 122 are aligned through the kinematic coupling so that the corresponding process channels align and/or seal for fluid delivery or extraction. Facilities module 120 includes valves 104a through 104d mounted on base 121 and a plurality of inlets and outlets for process fluids 108a-d, wherein the inlets and the outlets correspond to or represent a superset of the fluid channels within base 121. Motor or drive 124 is used to provide rotation means to stir, agitate, brush, scrub, etc., as described in more detail below, or may not be used depending on the process module attached to the facilities module.

FIG. 3B is a cross sectional view of the flow cell shown in FIG. 3A in accordance with one embodiment of the invention. In FIG. 3B, pin 131 is illustrated to provide mating and alignment between the facilities portion 120 and process module portion 122. In FIG. 3B, a plurality of vacuum channels 115 may be defined within process module 122 in order to uniformly apply vacuum around annular peripheral channel 117. In one embodiment, facilities module 120 is composed of Polyetheretherketones (PEEK), while process module 122 is composed of polytetrafluoroethylene, such as TEFLON™. As facilities module 120 includes numerous flow paths that may be drilled out and may have threaded connections, PEEK or a similar inert material is sufficiently durable to withstand this machining. Facilities module 120 and process module 122 may be any suitable material compatible with the chemicals and processing conditions within the reactor region and are not limited to the materials specified above. For example, certain highly acidic or corrosive materials may not be compatible with PEEK and/or TEFLON™. Thus, the composition of the facilities module may be different or may be the same material used for the process module and the materials are not limited to the above mentioned materials as any material compatible with the processes and applications described herein may be utilized with the embodiments described herein.

FIG. 3C is an alternative cross sectional view of the modular flow cell of FIG. 3A in accordance with one embodiment of the invention. As illustrated, valves 104a and 104d are mounted on top of a base plate of facilities module 120, where the channels from these valves are directed to mate with corresponding inlets on a top surface of process module 122. In this embodiment, process outlet 112 delivers fluid to process module 122. Based on the valve setup and configuration of delivery lines within facility module 120, process outlet 112 can deliver any suitable fluid or combination of fluids to process module 122. Process module 122 can then distribute the fluid through any flow path, for example, the 4 fluid input through valves 104a-d may be combined into one channel in process module 122, or may remain one or more separate channels through process module 122 for possible mixing in the reaction chamber. In the embodiment of FIG. 3C a radial flow or a side-to-side flow may be provided to surface 115 of an underlying substrate through the fluid and waste paths shown by paths 114 and 116.

Figure 3D:
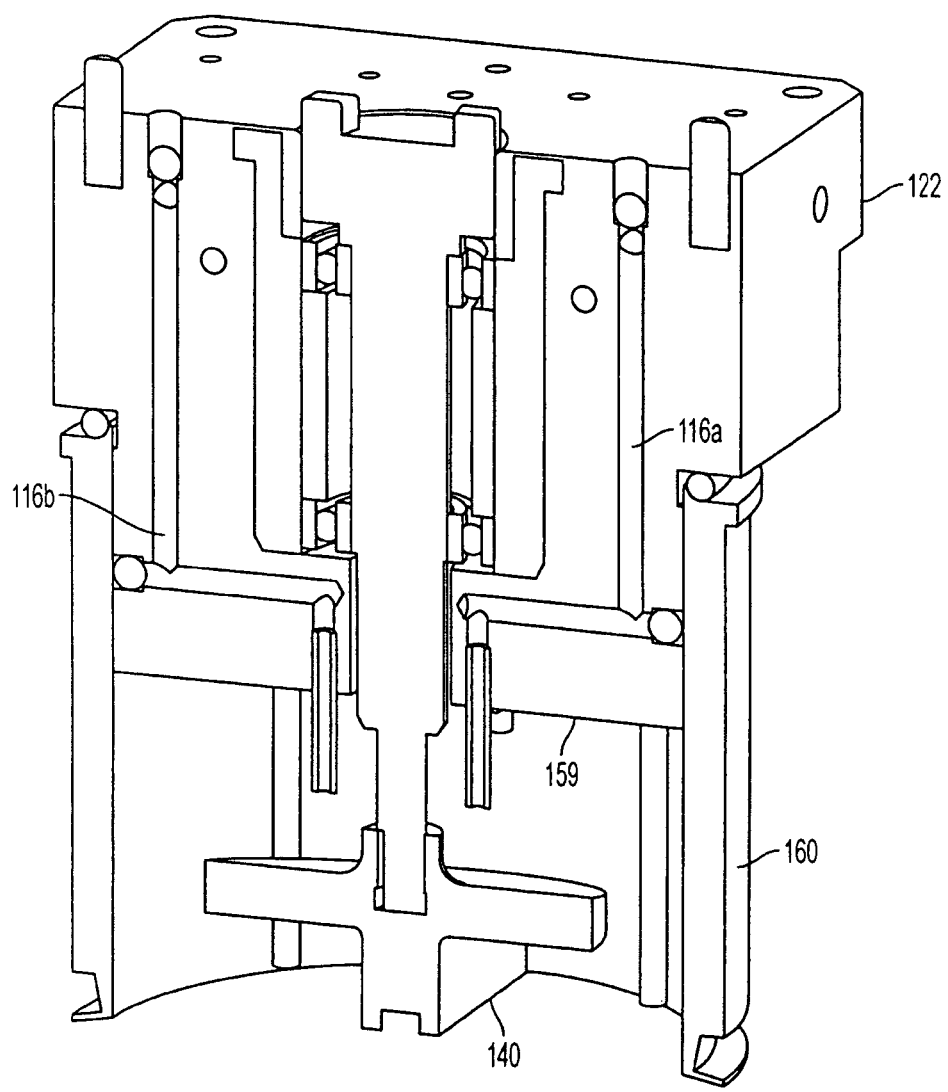
FIG. 3D is a simplified schematic diagram illustrating further details on a process module in accordance with one embodiment of the invention.

FIG. 3D is a simplified schematic diagram illustrating further details on a process module in accordance with one embodiment of the invention. Process module 122 includes channels 116a and 116b which provide pathways for a fluid to be delivered into a reaction chamber defined within sleeve 160 and below surface 159. As described herein, sleeve 160 forms a seal against a surface of a substrate in order to define a reaction region thereon. Process module 122 includes stirrer 140 which provides agitation in one embodiment. A shaft extending through process module 122 will mate with a drive of the facilities portion in order to provide the rotation for stirrer 140. It should be appreciated that while the embodiments show the shaft having a keyed mating connection other types of connections known in the industry may be applied to the embodiments described herein. In addition, channels 116a and 116b are illustrative and may be alternatively routed through process module 122, depending on the application. One skilled in the art will appreciate through the various drilling techniques numerous configurations are available for the routing of the fluid channels within process module 122. As described above, vacuum channels may proceed through process module 122 into the reaction chamber for the removal of fluid from the reaction chamber. The shaft provided for stirrer 140 includes bearings. One skilled in the art will appreciate that shaft may be sealed through techniques known in the industry in one embodiment as FIG. 3D is illustrative and not meant to be limiting. Exemplary sealing techniques include sealed bearings, O-rings, etc. Alternative attachments may be affixed to the shaft besides stirrer 140. That is, the attachments described herein for scrubbing, cleaning, and processing, e.g., the attachments of FIGS. 4A-D may be attached to the shaft.

In one embodiment, valves 104a through 104d of FIGS. 3A and 3C are three-way valves in which each valve may send process fluid to process module 122 or to waste. It should be appreciated that numerous combinations of different valves commercially available, whether the valves are two-way, three-way, etc., are easily employed into the design depending on the circumstances and desires of the user and the corresponding experiment. In process module 122, the various flows received from the facilities module are combined and distributed as desired. Again, through numerous drilling and combination sequences implemented in different process modules which may be attached to the facilities module which remains coupled to the tool, a plurality of experiments may be achieved so that multiple processing conditions may be evaluated combinatorially in an efficient manner.

Figure 4D:
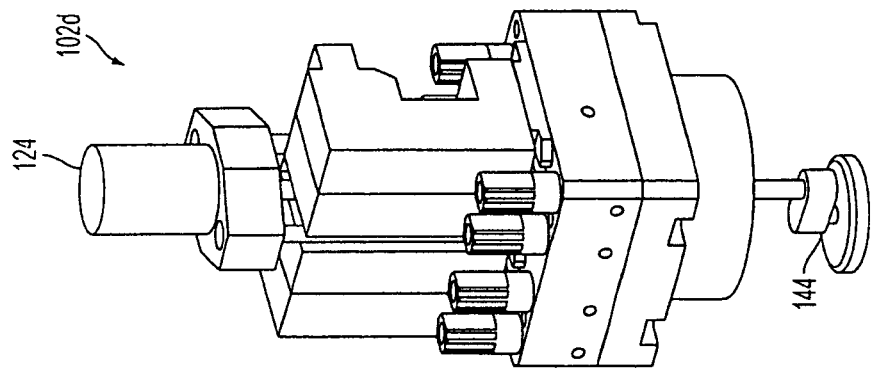
FIGS. 4A through 4D illustrate various process reactor modules that may be employed within the modular design for the flow cell described herein.
Figure 4C:
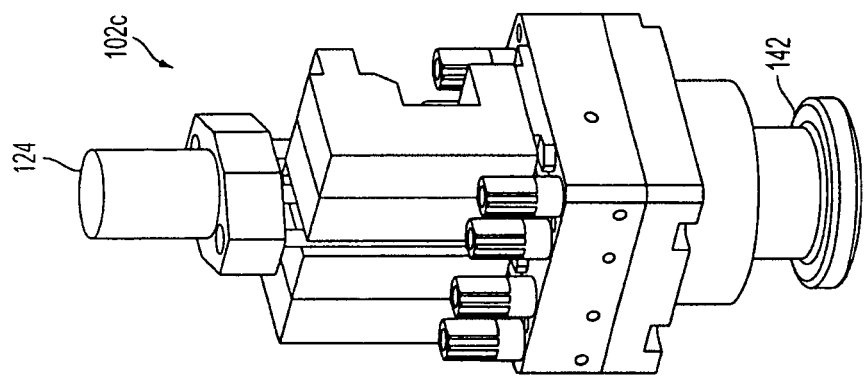
Figure 4B:
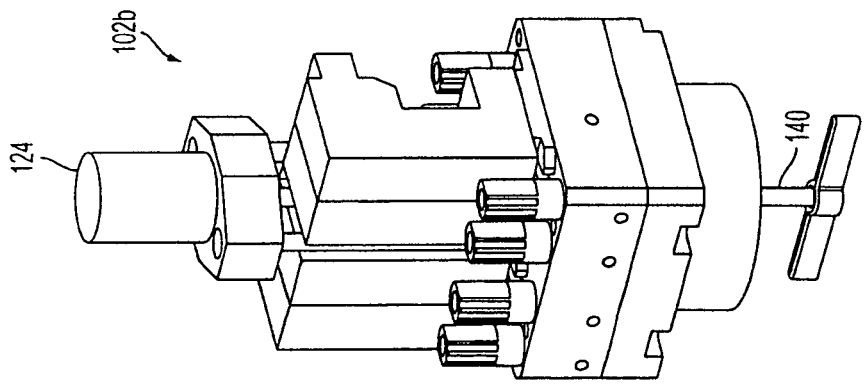
Figure 4A:
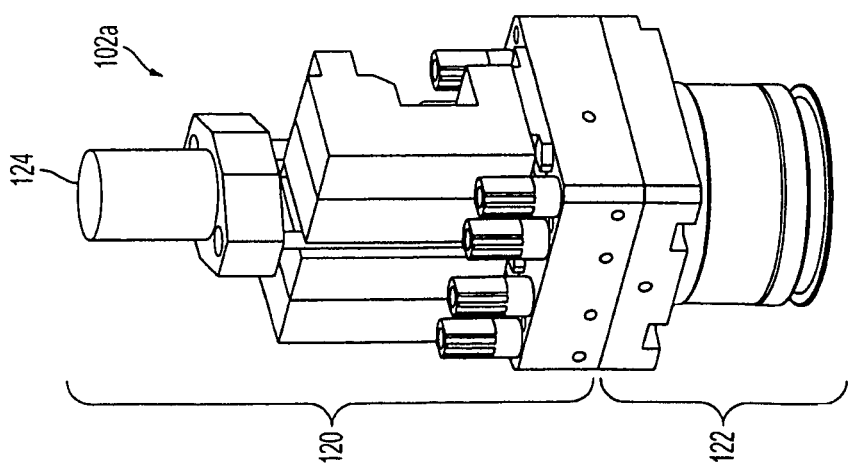

FIG. 4A through 4D illustrate various process reactor modules that may be employed within the modular design for the flow cell described herein. In FIG. 4A, a radial flow design is provided through a center channel and a peripheral vacuum channel as described above. Flow cell 102a includes facilities module 120 mounted on top of the process module 122. It should be appreciated that the facilities portion for each of FIGS. 4A through 4D is a common portion, i.e., is the same while the process module changes. Process module 120 having the radial flow in FIG. 4A, as well as the other process modules for FIGS. 4B through 4D, are interchangeable and mate with a base of the same facilities module even though the facilities being used and the process supported are different in each example herein. In FIG. 4B, the process module of flow cell 102b is configured to provide rotation for agitation or stirring through stirrer 140. While stirrer 140 is illustrated as a paddle, it should be noted that any blade or impeller configuration may be employed and the paddle configuration is not meant to be limiting. In FIG. 4C, a rotating disc is supplied in order to accommodate any scrubbing, cleaning, or other operations suitable for semiconductor processing. Rotating disc 142 is rotated by drive 124 disposed on the facilities portion of flow cell 102c. It should be appreciated that drive 124 may or may not be used to provide rotation to a shaft coupled to a stirrer, disc, pad, etc., based on the configuration of the process module. FIG. 4A does not use rotation, however, the facilities module includes drive 124 in this embodiment as the facilities module often includes a super set of the necessary facilities in order to allow enough flexibility to swap out the necessary process modules. The process module of FIG. 4A does not have the shaft channel defined therethrough, while the embodiments of FIGS. 4B-4D include the shaft channel to affix the component to be rotated with drive 124. Drive 124 may be any suitable drive or actuator, such as a step motor, linear drive, screw drive, etc.

FIG. 4D illustrates another alternative embodiment for the modular flow cell in accordance with one embodiment of the invention. Flow cell 102d includes a brush/chemical mechanical planarization pad 144. Here, the axis of rotation for brush 144 is different than an axis of the brush and may move in a planetary fashion. Again, drive 124 is used to supply the rotation to a shaft in order to rotate brush 144 that is coupled to the shaft. It should be noted that numerous other alternatives for the process module are capable and that the designs listed herein are not meant to be limiting. Other suitable process modules may include fixed electrodes, rotating electrodes, in-situ measurement devices, rotating wafer holders, etc.

Figure 5:
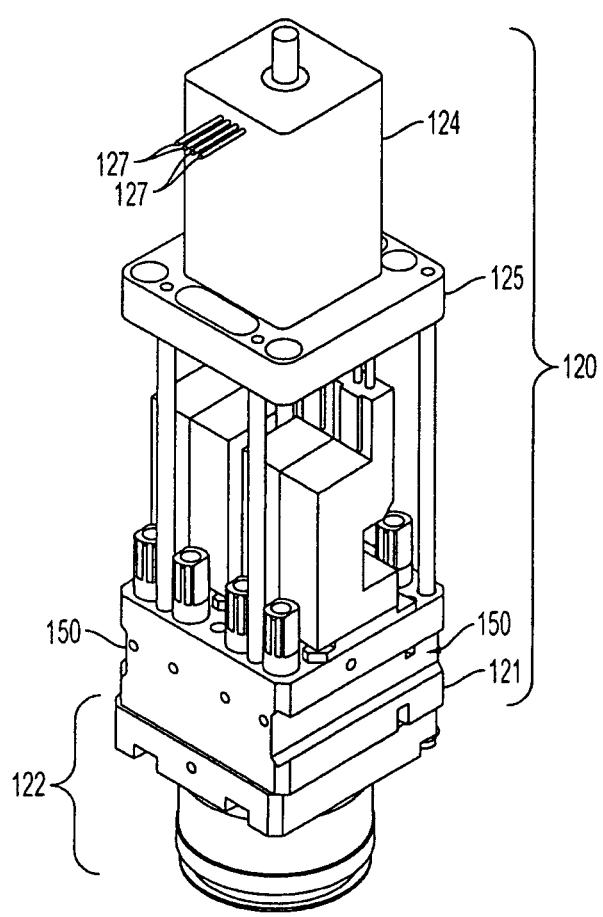
FIG. 5 is a simplified schematic diagram of a modular process head configured to adjust to a pitch or provide a variable pitch of regions on a substrate in accordance with one embodiment of the invention.

FIG. 5 is a simplified schematic diagram of a modular process head configured to adjust to a pitch or provide a variable pitch of regions on a substrate in accordance with one embodiment of the invention. The pitch is the spacing between the flow cells which should be matched to the regions on the substrate, which may vary by customer or application (e.g., due to die size difference, test structure location, or other requirements) and thus another embodiment of the invention enables the flow cells to be easily moved to adjust for the variable pitch. Modular flow cell 102 includes drive 124 having electrical connections 127 and corresponding facilities module 120 mounted on process module 122. In one embodiment, facilities module 120 may include conductive traces that mate with corresponding conductive traces of process module 122. The conductive traces within process module 122 may bring a voltage or current to any portion of the reaction region or substrate surface in order to enable an interaction or step of the process. Alternatively, the conductive traces within process module 122 may be utilized to send or receive signals to or from a monitoring device configured to provide data for characterizing the reaction or process taking place within a reaction region. Thus, in one case, the conductive trace may provide an electrical signal that actively participates in the combinatorial processing and in another case the conductive trace may passively monitor the combinatorial processing. Exemplary monitoring devices may include a pH probe, temperature probe, pressure gauge, flow meter, etc. Facilities module 120 is configured to provide facility process supplies, i.e., process gasses, chemicals, electricity, or any other process consumable utilized during the processing, through a standard interface in accordance with one embodiment of the invention.

Figure 9:
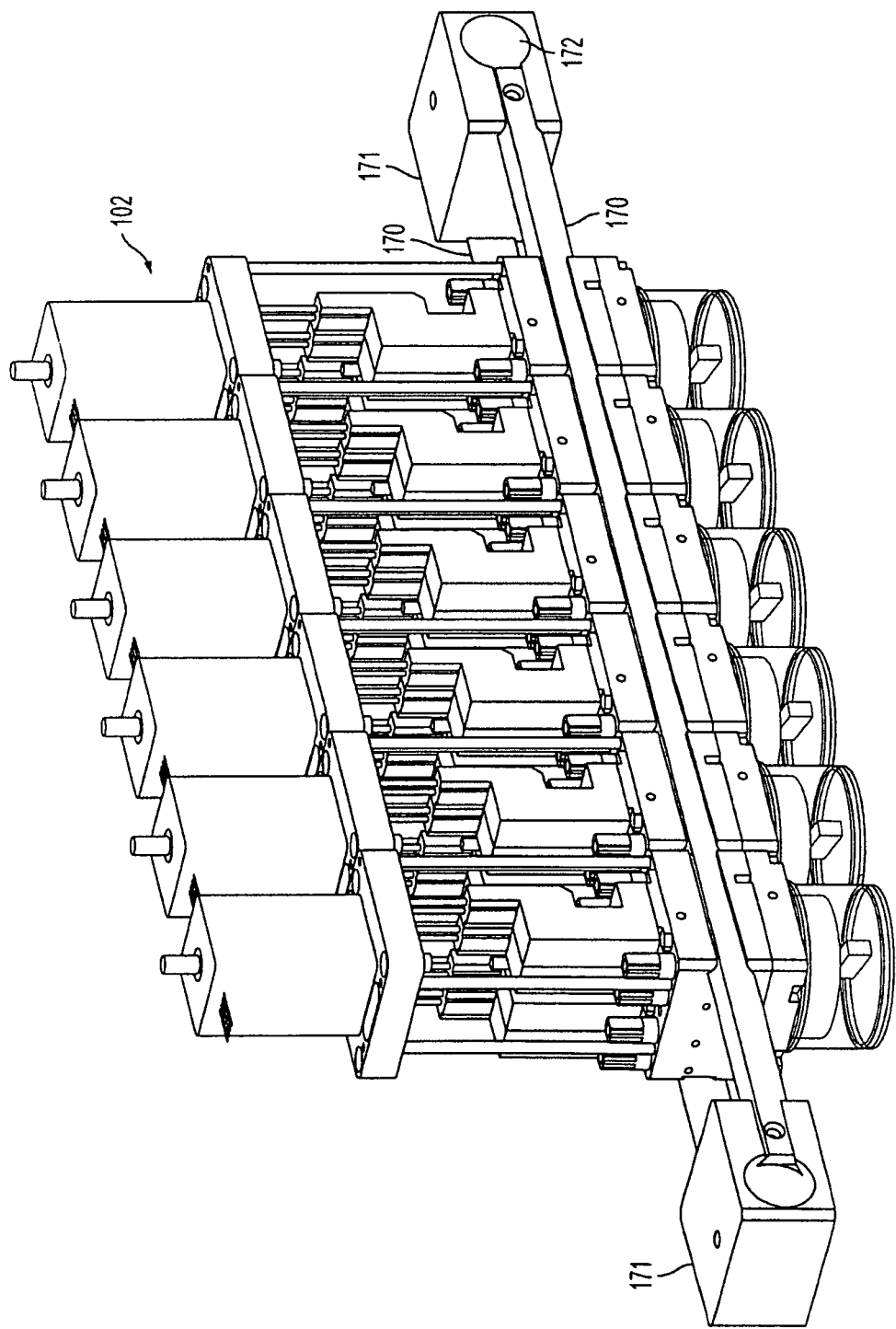
FIG. 9 is a simplified schematic diagram illustrating a plurality of flow cells accommodated through a rail in accordance with one embodiment of the invention.

Within a lower portion of facilities module 120, slot 150 is defined thereon in order to accommodate a rail so that a plurality of the flow cells 102 may be combined as described with regards to FIGS. 9 and 10. In FIG. 5, slot 150 may be designed on opposing sides, or may be provided or embedded on only one side, of the flow cell 102 in order for the rail to support flow cell 102. Drive 124 is mounted on platform 125, which is supported by posts connected to base 121, but may be mounted in other ways based on design choices.

Figure 6:
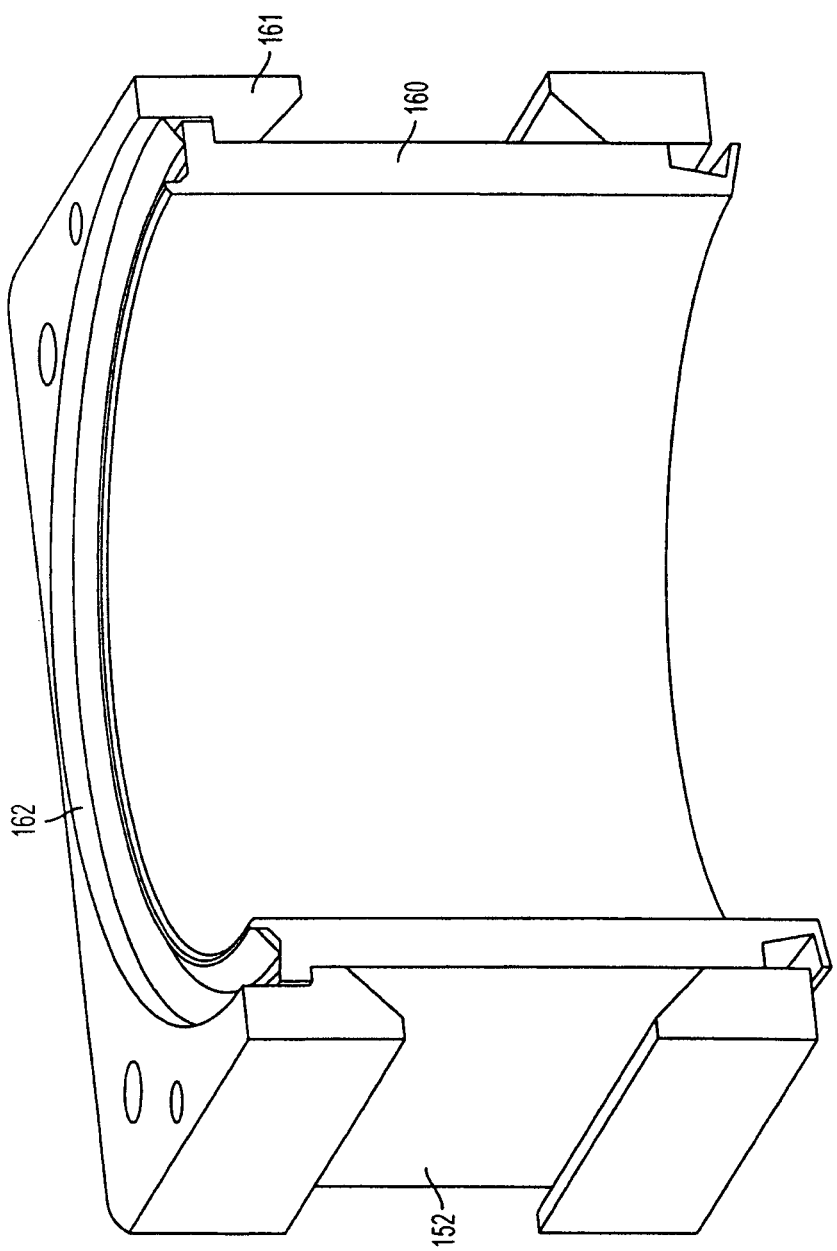
FIG. 6 is a simplified schematic diagram for a sleeve within a modular block enclosure designed that defines a processing region around and below the process module when disposed over a substrate in accordance with one embodiment of the invention.

FIG. 6 is a simplified schematic diagram for a sleeve, which is designed to cover a lower portion of the monolithic block, shown in FIGS. 2A-B or the process modules described elsewhere herein, that defines the reaction region for flow cell 102. Sleeve 102 can be used with or as a replacement of the fixed manifold shown in FIG. 1. With the fixed manifold of FIG. 1, a new manifold must be drilled or tooled if the pitch of flow cells 102 is modified, however, with the sleeve or FIG. 6, the reaction chamber moves dynamically with the flow cell. It should be appreciated that in the embodiment without the fixed manifold, the flow cell is capable of being positioned over the substrate as described with reference to FIGS. 7-10B.

In FIG. 6, a bottom surface of sleeve 160 is designed to seal with a top surface of a substrate and encompass the lower portion of process module 122. The seal to the top surface of the substrate may be formed from, for example, an O-ring, a flexible lip (as shown) or other mechanism. O ring 162 sits on a shoulder defined on a top surface of sleeve 160 and provides an upper seal with a shoulder of process module 122. In one embodiment, o-ring 162 may provide a seal with a bottom surface of facilities module 120. In this manner, the processing region is isolated from an external environment. Slot 152 may be defined on opposing sides (or a single side) of the block encompassing sleeve 160 in order to mate with a corresponding rail as described with the base of the facilities module of FIG. 7. Thus, the sleeves and the enclosures are moveable along with the flow cell in order to eliminate the need for a monolithic plate that has a fixed pitch for the location of the reaction regions relative to the surface of the substrate. Slot 152 may also be located on the facilities module (or both slot 150 of FIG. 5 and slot 152 of FIG. 6 may be located on the process module if there is sufficient space available). It should be appreciated, that slots 150 and 152 may be located on the monolithic block of the flow cell shown in FIGS. 2A-B in another embodiment.

In one embodiment, sleeve 160 may be formed from polytetrafluoroethylene, while enclosure 161 may be formed from any suitable material capable of supporting sleeve 160 and withstanding the movement along the rails. O-ring 162 may be composed of any chemically inert material compatible with the fluids used for processing and is capable of deformation to form a seal with a surface.

Figure 7:
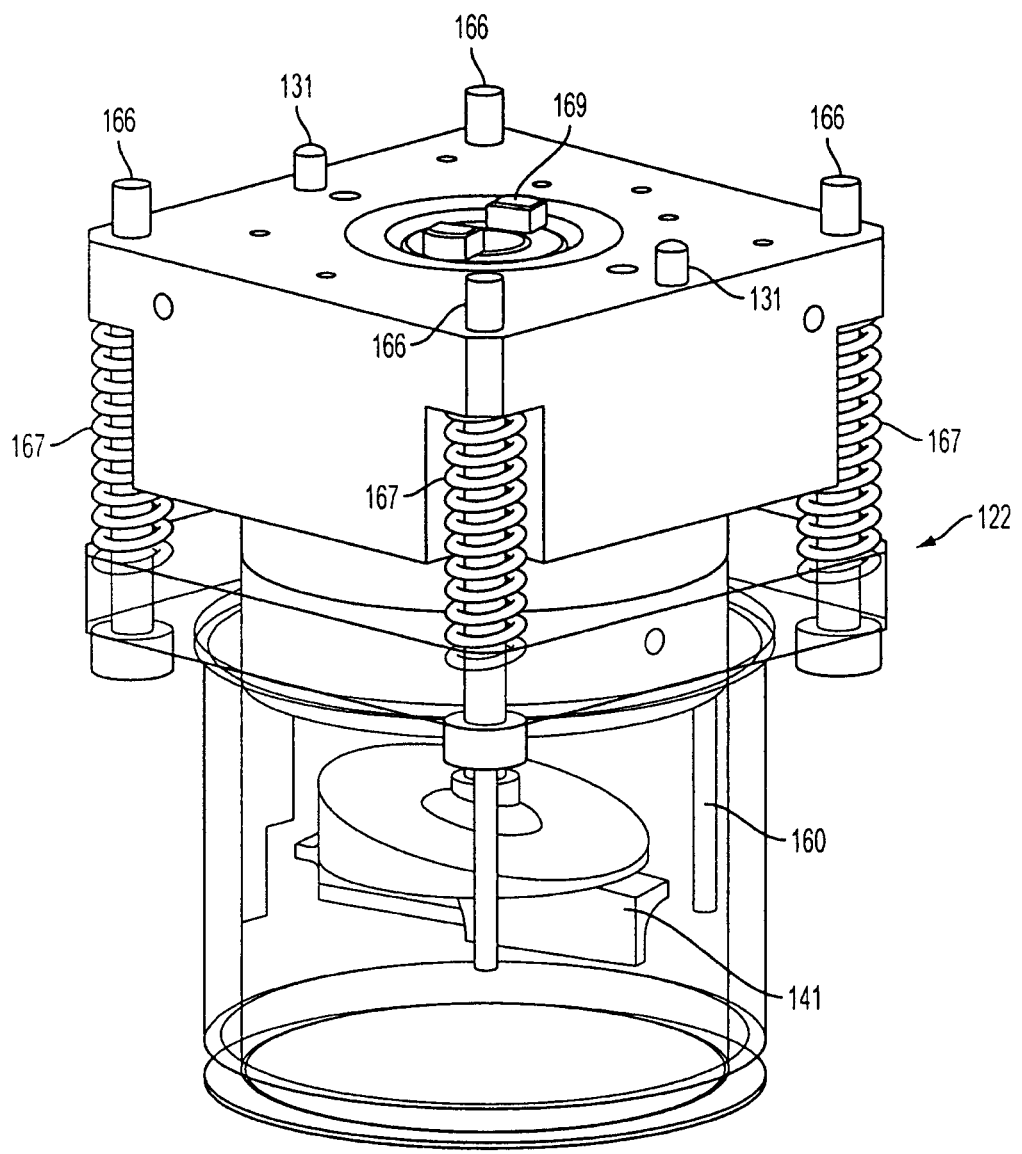
FIG. 7 is a simplified schematic diagram of a process flow module of a flow cell with an integrated spring loaded sleeve in accordance with one embodiment of the invention.

FIG. 7 is a simplified schematic diagram of a process module of a flow cell having an integrated spring loaded sleeve in accordance with one embodiment of the invention. Process module 122 is integrated with sleeve 160 via screws 166 and springs 167. One skilled in the art will appreciate that springs 167 provide a downward force to seal the lower lip of sleeve 160 against a substrate surface as screws 166 are tightened to a corresponding facilities module. Pins 131 are used for coupling process module 122 to a corresponding facilities module. Shaft 169 couples to a corresponding section of a facilities module to provide rotational force for agitator 141. It should be appreciated that numerous connection configurations for shaft 169 are possible, such as keyed configurations, etc. In one embodiment, the reaction manifold defining the plurality of reaction chambers that the lower portion of process module 122 is inserted into, may be eliminated as the integrated sleeve of FIG. 7 is capable of defining the reaction region over the surface of the substrate. In one embodiment, a single spring around an upper surface of sleeve 160 may be used rather than four separate springs.

Figure 8:
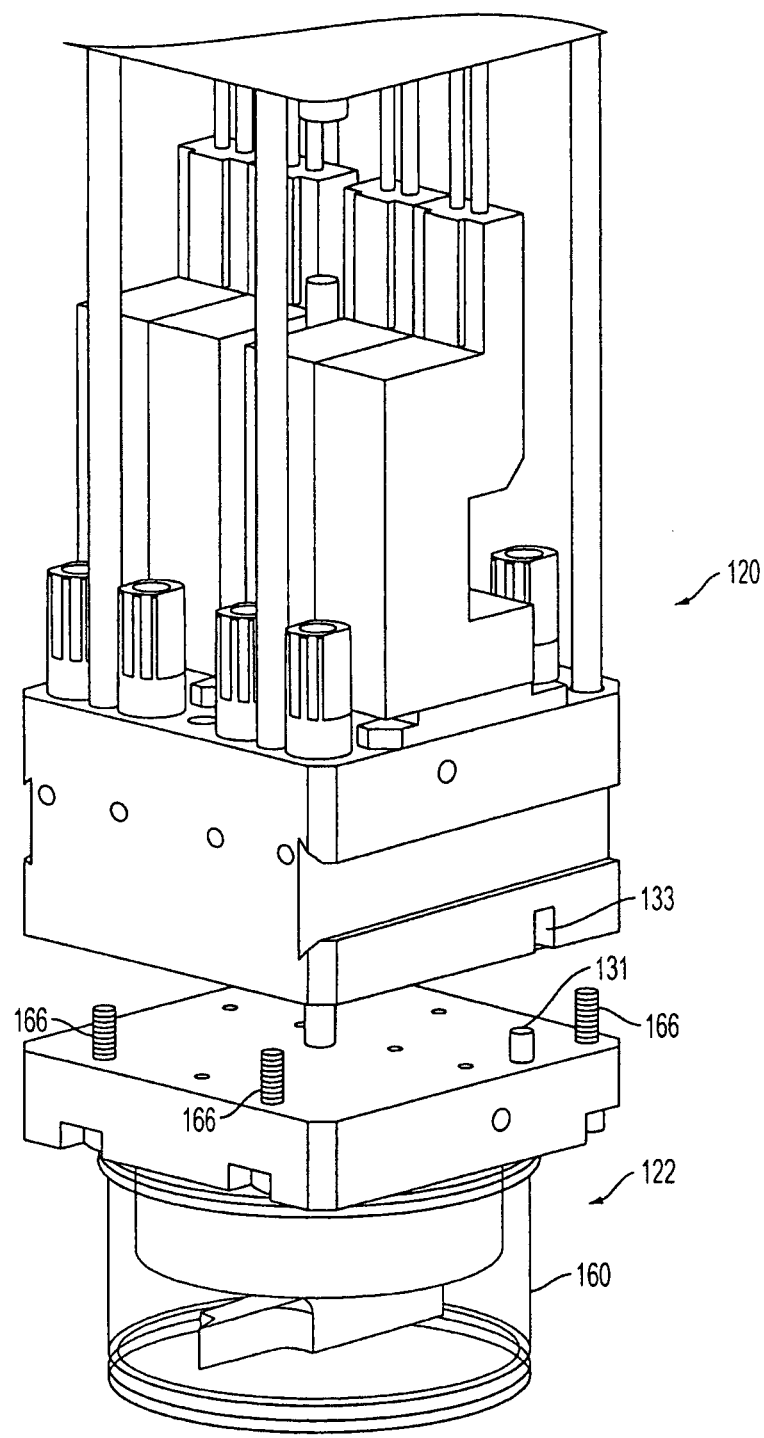
FIG. 8 is an alternative simplified schematic diagram illustrating a mating configuration for the facilities module and the process module in accordance with one design.

FIG. 8 is an alternative simplified schematic diagram illustrating a mating configuration for the facilities module and the process module in accordance with one design. Facilities module 120 mounts on top of process module 122. In one embodiment, screws 166 may be used to affix facilities module 120 and process module 122. Alignment of facilities module 120 and process module 122 may be accomplished through pin 131 disposed on a top surface of process module 122 that mates with slot 133 defined on the base of facilities module 120. In one embodiment, screws 166 provide for increased pressure to mate the process and facilities modules so that corresponding channels on the mating surfaces of the facilities and the process modules engage for a leak-free seal. In another embodiment, the opening for corresponding fluid channels on one or both of the opposing surfaces may have O-rings disposed thereon to provide the leak-free seal. Sleeve 160 is transparently illustrated so that the processing region defined by the bottom portion of the process module and encompassed by sleeve 160 may be illustrated. It should be noted that the volume of the process region may be adjusted based on the distance that the base of the process module is from the surface of the substrate. As each process module is interchangeable, the facilities module may be consistently sized irrespective of the different processing region volumes that the processing modules may define. For example, the processing region volume for the flow cells with an agitator may be different that the processing region volumes for a radial flow module, where the facilities modules remain consistent. In an alternative embodiment, the process module may be adjustable to modify the reaction volume or the entire system may be moveable in a vertical direction vis-à-vis the substrate.

In addition to flow modes where the fluids are continuously dispensed into the reactor and continuously removed from the reactor (i.e. flowed through the reactor and across the region), the flow cell may support a bucket mode. In the bucket mode fluids are dispensed into a reactor, allowed to react with the region of the substrate for a desired amount of time, and are evacuated from the reactor after the operation is complete. As an example, in bucket mode processing, the fluids may be separated from the bottom of the flow cell head by a gap (e.g., 5-10 mm) that is larger than a gap for the flow mode.

FIG. 9 is a simplified schematic diagram illustrating a plurality of flow cells accommodated through a rail in accordance with one embodiment of the invention. Rail 170 will support a row of flow cells 102. As illustrated, rails 170 are attached to corresponding sides of the facilities modules of the flow cells, though it may be coupled to only one side and may be coupled to either the facilities or process portion in case of the modular flow cell. Rails 170 are connected to blocks 171 which are slideably mounted onto a rod or support member (not shown) through holes 172 for support over the surface of a substrate in this embodiment. As illustrated in FIG. 9, each one of flow cells 102 is slidable in order to adjust to any pitch (i.e., the distance between cells) necessary as desired or defined by a corresponding substrate to be processed. The flow cells can be set in place, e.g., through a set screw against rails 170, in one embodiment. Alternatively, as the process module will be inserted into a process chamber, the tolerances may be such that the flow cells need not be set in place. It should be appreciated that blocks 171 may be adjusted vertically through some suitable mechanism in order to lift and lower the flow cell, e.g., from a reactor block as illustrated in FIG. 1. While flow cells 102 are illustrated with similar process modules disposed thereunder, it should be appreciated that any number of process modules may be incorporated into the flow cells whether the process modules are identical or different. That is, each of the flow cells may have different process modules as dictated by the experiment being performed. Accordingly, the flexible nature of the flow cells and the support structure enables further combinations of tests or process sequences to be performed on a single substrate.

Figure 10A:
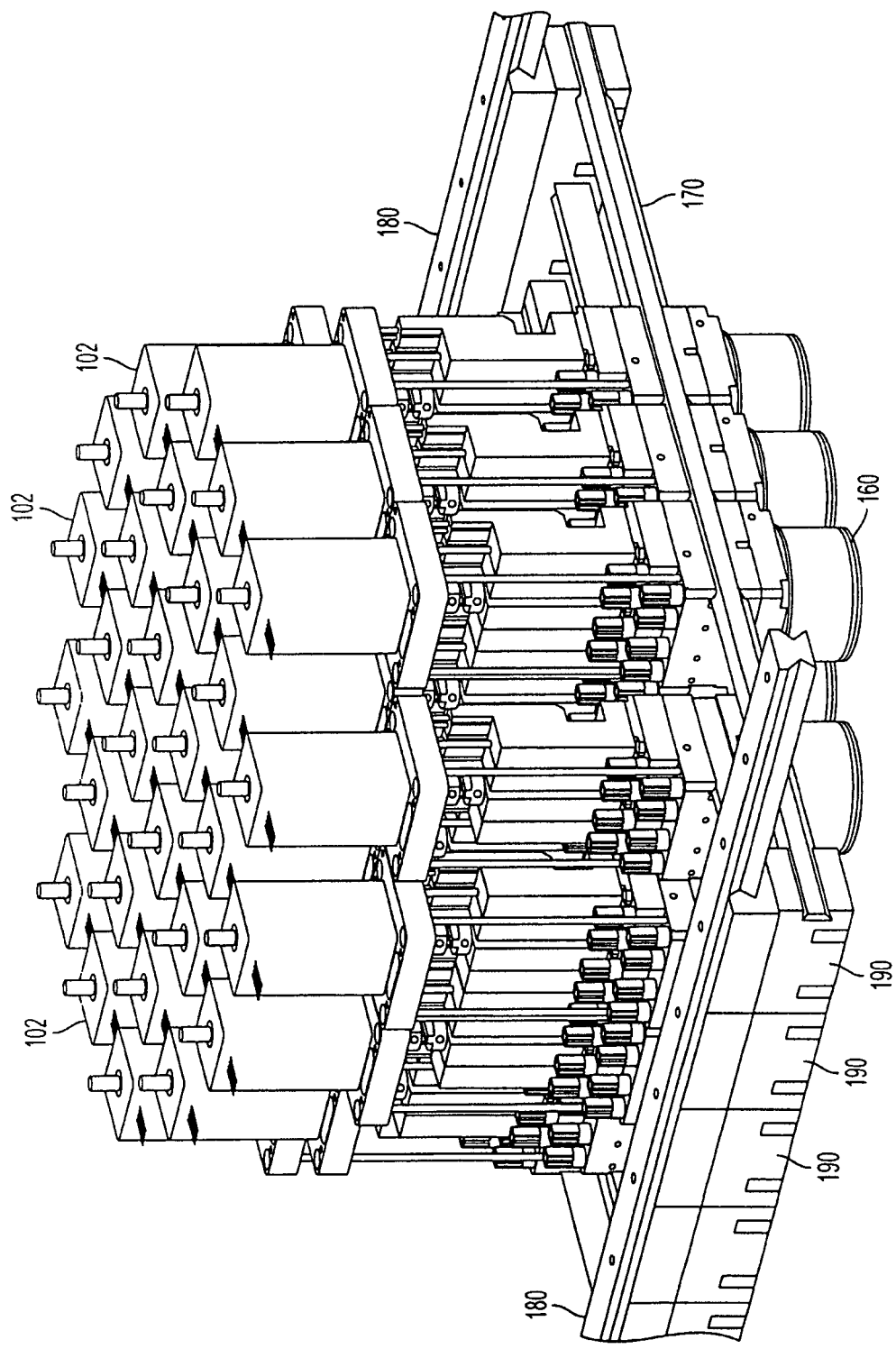
FIG. 10A is a simplified schematic diagram illustrating the details of the flow cells mounted onto a system to accommodate a desired pitch of a substrate to be processed in accordance with one embodiment of the invention.

FIG. 10A is a simplified schematic diagram illustrating the details of the flow cells mounted onto a system to accommodate a desired pitch of a substrate to be processed in accordance with one embodiment of the invention. Flow cells 102 are mounted on corresponding rails 170 which are supported through rails 180. A modular design is provided for flow cells 102 as well as modular blocks 190 for each corresponding row of flow cells. For example, the modular blocks 190 can be moved to adjust the pitch along the rail 180. In addition, a modular sleeve enclosure is provided for a lower portion of each process module in one embodiment, thereby enabling adaptability of the system to any pitch of regions on a substrate. However, the fixed manifold shown in FIG. 1 can still be used, but requires machining a new manifold for each pitch variation.

In the manner described above, flow cells 102 may be moved in one linear direction as they are slideably mounted on rails 170 of one rail system and the corresponding rows to which each flow cell belongs is slideably mounted on rails 180 of a second rail system. Thus, the movement of the rows along rails 180 is in a linear direction substantially perpendicular to the direction of movement along rails 170, enabling access to the entire surface of a substrate disposed thereunder. In this embodiment, the first row of flow cells includes three flow cells while the next row includes five and the row thereafter includes six. This pattern is repeated for the next three rows so that a total of 28 flow cells are accommodated in this configuration. For example, a 12-inch wafer having the 28 regions could be accommodated in this design. Of course, this design is not meant to be limiting as the size and shape of the flow cells or the size and shape of the substrate to be processed may be any suitable geometric shape. Those dimensions and characteristics will inform the specific default configuration of the flow cells and their positioning for any specific process. Since each flow cell is modularly designed a number of different experiments may be provided with the 28 corresponding flow cells. In addition, certain flow cells may be set aside or parked outside the area of the substrate to be processed as rails 170 and 180 are configured to enable enough space to accommodate one or more flow cells 102 outside of the substrate boundary region. For example, one whole row of flow cells 102 may be moved along rails 180 outside of the substrate boundary region. Thus, through the slidable mounting and rail configuration any pitch for any substrate may be accommodated with this design. It should be noted that the monolithic flow cells of FIGS. 2A-B may be incorporated with the modular sleeve enclosure, also referred to as a reaction chamber, in accordance with one embodiment of the invention.

Figure 10B:
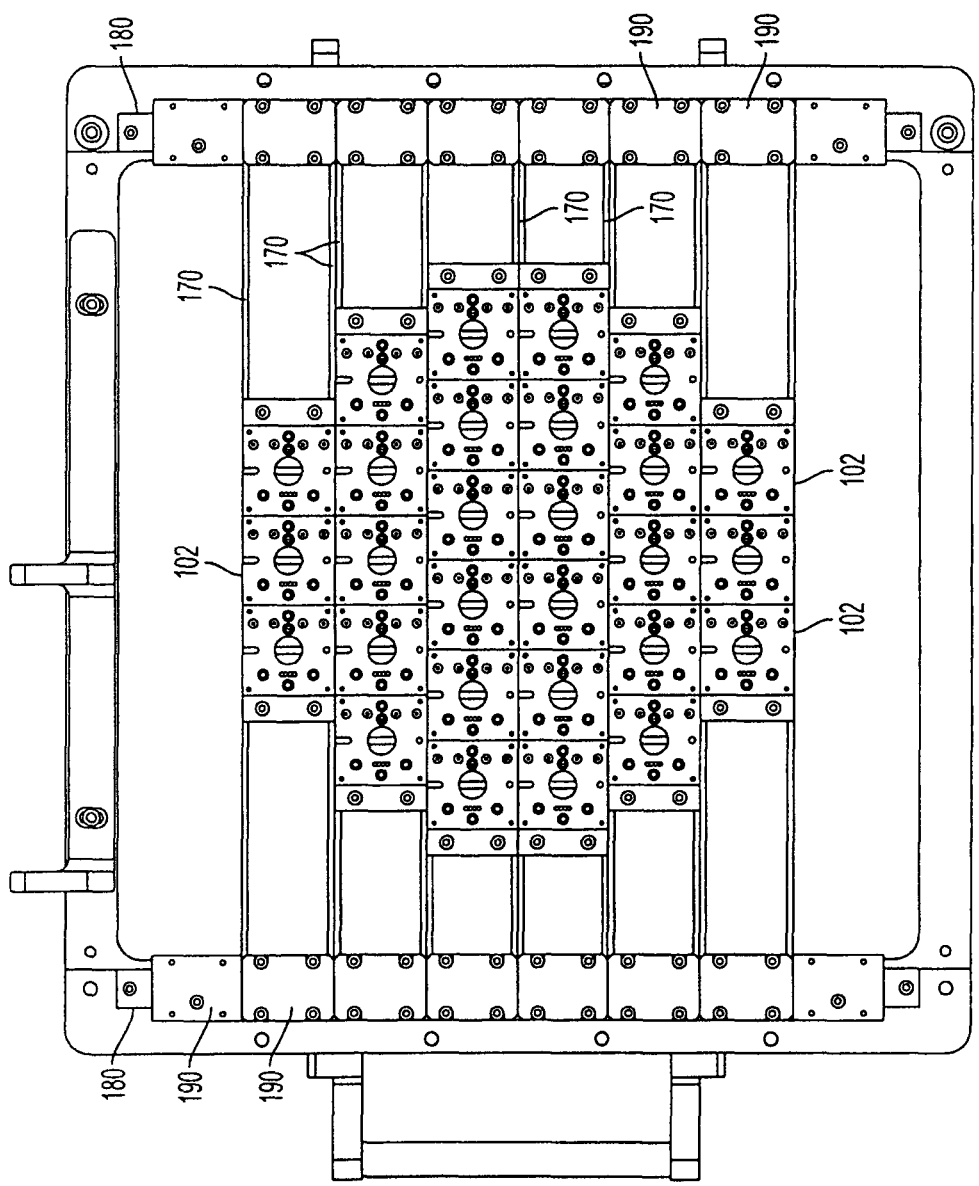
FIG. 10B is a simplified schematic diagram illustrating a bottom cross-sectional view of a system of flow cells accommodating various desired pitches of a substrate to be processed in accordance with one embodiment of the invention.

FIG. 10B is a simplified schematic diagram illustrating a cross-sectional view of a system of flow cells accommodating various desired pitches of a substrate to be processed in accordance with one embodiment of the invention. The view illustrated in FIG. 10B is a bottom cross-sectional view, i.e., a view having a viewpoint from a bottom surface of the system, e.g., from the substrate disposed below flow cells 102. Flow cells 102 are slideably mounted on rails 170. Rails 170 are slideably attached to rails 180 and modular blocks 190. In one embodiment, rails 170 and 180 are substantially orthogonal to each other. As mentioned above, modular blocks 190 may be moved to adjust the pitch along rail 180. The pattern illustrated in FIG. 10B is the pattern of 28 flow cells, however, as mentioned above, this pattern is illustrative and not meant to be restrictive. In addition, while a bottom cross-sectional view of flow cells 102 illustrates a certain configuration of channels and a center shaft for providing rotational means, alternative configurations are possible for each of the flow cells. In one embodiment, the flow cells may be varied among each other within the pattern in order to provide further combinatorial processing experiments on a single substrate.

Figure 11:
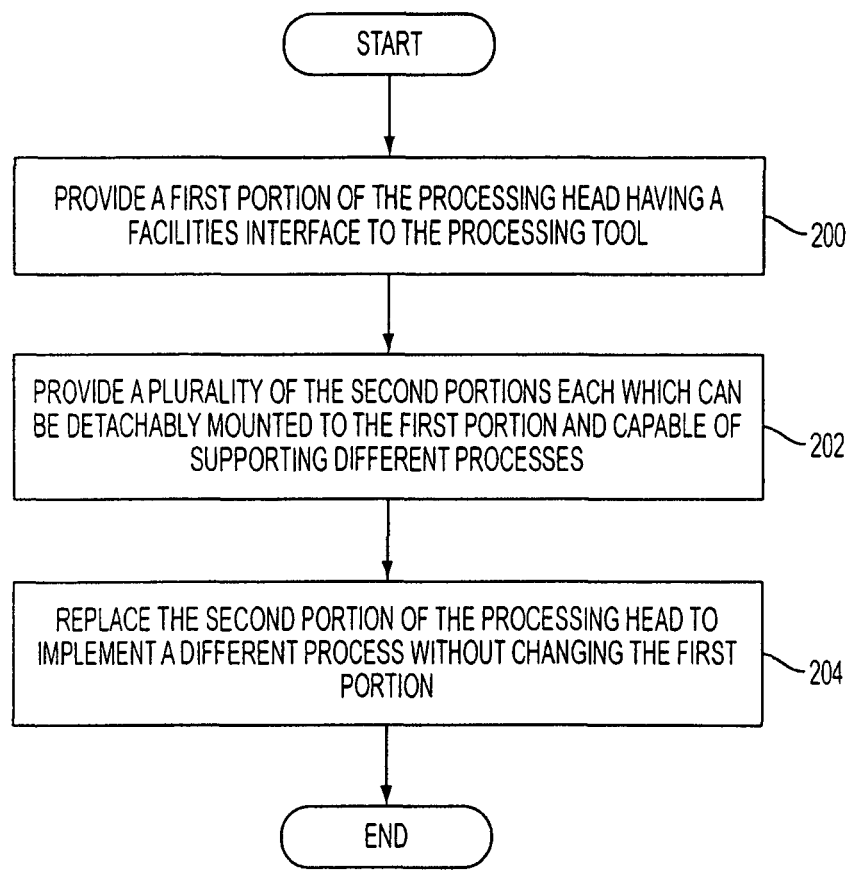
FIG. 11 is a flowchart diagram of the method operations for modifying the capability of a processing head in a combinatorial processing system in accordance with one embodiment of the invention.

FIG. 11 is a flowchart diagram of the method operations for modifying the capability of a processing head in a combinatorial processing system in accordance with one embodiment of the invention. The method initiates with operation 200 where a first portion of the processing head having a facilities interface is provided. As illustrated in FIGS. 3A-C, the first portion receives various facilities such as fluid supplies from fluid sources, electrical inputs, vacuum, etc. The method then advances to operation 202 where a plurality of second portions are detachably mounted to corresponding first portions. In one embodiment, different second portions support different processes. A substrate may be combinatorially processed and then the second portion of the processing head for one or more flow cells may be replaced as specified in operation 204. As the facilities portion is not replaced, the changeover is more efficient as the process portion may be kinematically coupled to the facilities portion as described above. It should be appreciated that the system is capable of supporting a number of pitch configurations through the adjustable and modifiable rail configuration of FIGS. 9 and 10. One set of rails can support a row of flow cells that are individually adjustable as illustrated with reference to FIG. 9. The respective ends of these rails may be supported by another set of rails as illustrated with reference to FIG. 10. In another embodiment, the flow cells may be moved vertically as illustrated with reference to FIG. 1. Thus, the embodiments described herein enable movement of the flow cells in three dimensions, i.e., X, Y, and Z directions.

It should be appreciated that the embodiments described herein accommodate a multi-channel site-isolated reactor having independent or modular process modules that can be easily changed. In the embodiments described above, one module contains the necessary connections for the facilities connections to the reactor and a separate module dictates the flow dynamics and overall reactor characteristics.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A combinatorial processing system, comprising:
   a plurality of reaction chambers each having a sidewall defining a respective reaction region, each of the plurality of reaction chambers is moveable but fixed in place when performing processing;
   a plurality of dispense heads configured to be partially inserted into a corresponding one of the plurality of reaction chambers, wherein each one of the plurality of dispense heads include a facilities supply portion and a reactor portion detachably coupled to each other, and wherein a bottom surface of the reactor portion is configured to function as a top surface of the corresponding one of the plurality of reaction chambers encompassing the respective reaction region; and
   wherein the facilities supply portion is slidably mounted on a first rail and the first rail is slidably mounted on a second rail and wherein the first rail is orthogonal to the second rail.

2. The system of claim 1, wherein the each one of the plurality of dispense heads is independently moveable and the corresponding one of the plurality of reaction chambers moves with the corresponding one of the dispense heads, wherein the dispense heads are fixed in place when performing processing.

3. The system of claim 1, wherein the plurality of dispense heads are moveable in two directions and wherein one of the plurality of dispense heads can be slidably moved outside of a peripheral region defined by a substrate surface to be processed by the combinatorial processing system.

4. The system of claim 1, wherein the plurality of dispense heads are arranged in a row defined by the first rail onto which the plurality of dispense heads are mounted and wherein the reactor portion of each of the plurality of dispense heads defines a different reaction region volume.

5. The system of claim 1, wherein a removable sleeve defines the respective sidewall of each of the corresponding reaction chambers.

6. The system of claim 1, wherein the plurality of dispense heads and the plurality of reaction chambers are slidably affixed to the first rail.

7. The system of claim 1, wherein the system performs combinatorial processing where multiple areas of a substrate are processed differently to achieve different results.

* * * * *